(12) United States Patent
Zhang et al.

(10) Patent No.: US 12,107,046 B2
(45) Date of Patent: Oct. 1, 2024

(54) L-SHAPED STEPPED WORD LINE STRUCTURE, METHOD OF MANUFACTURING THE SAME, AND THREE-DIMENSIONAL MEMORY

(71) Applicant: Institute of Microelectronics, Chinese Academy of Sciences, Beijing (CN)

(72) Inventors: Gang Zhang, Beijing (CN); Zongliang Huo, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 366 days.

(21) Appl. No.: 17/597,907

(22) PCT Filed: Jul. 31, 2019

(86) PCT No.: PCT/CN2019/098595
§ 371 (c)(1),
(2) Date: Jan. 28, 2022

(87) PCT Pub. No.: WO2021/016922
PCT Pub. Date: Feb. 4, 2021

(65) Prior Publication Data
US 2022/0246526 A1   Aug. 4, 2022

(51) Int. Cl.
*H01L 23/528* (2006.01)
*H01L 21/768* (2006.01)
*H01L 23/535* (2006.01)

(52) U.S. Cl.
CPC .... *H01L 23/5283* (2013.01); *H01L 21/76805* (2013.01); *H01L 21/76816* (2013.01); *H01L 21/76895* (2013.01); *H01L 23/535* (2013.01)

(58) Field of Classification Search
CPC ............... H01L 23/5283; H01L 23/535; H01L 21/76805; H01L 21/76816;
(Continued)

(56) References Cited

U.S. PATENT DOCUMENTS

| 2013/0126957 A1 | 5/2013 | Higashitani et al. |
| 2014/0042512 A1 | 2/2014 | Jeon |
| 2019/0043883 A1* | 2/2019 | Xu .................... H01L 21/76802 |

FOREIGN PATENT DOCUMENTS

| CN | 103545261 A | 1/2014 |
| CN | 108428703 A | 8/2018 |

OTHER PUBLICATIONS

"International Application Serial No. PCT/CN2019/098595, International Search Report dated May 13, 2020", w/ English Translation, (May 13, 2020), 5 pgs.
(Continued)

*Primary Examiner* — Shahed Ahmed
*Assistant Examiner* — Vicki B. Booker
(74) *Attorney, Agent, or Firm* — Schwegman Lundberg & Woessner, P.A.

(57) ABSTRACT

Provided is an L-shaped stepped word line structure including: L-shaped word line units, each including a long side extending in a second direction and arranged adjacent to a gate line slit, and a short side extending in a first direction. A word line terminal included in the short side is formed in a stepped stacked layer structure including stacked layer pairs formed of an insulating material, a region close to the gate line slit in a stacked layer of each stacked layer pair serves as a replacement metal region including a short side region surface/internal metal layer respectively located on a surface/in an interior. In a first direction, a length of the short side region surface metal layer is greater than that of the short side region internal metal layer, and the word line terminal corresponds to the short side region surface metal layer.

15 Claims, 6 Drawing Sheets

(58) Field of Classification Search
CPC ... H01L 21/76895; H10B 43/10; H10B 43/27; H10B 43/50
See application file for complete search history.

(56) References Cited

OTHER PUBLICATIONS

"International Application Serial No. PCT/CN2019/098595, Written Opinion dated May 13, 2020", (May 13, 2020), 4 pgs.

* cited by examiner

L-SHAPED STEPPED WORD LINE STRUCTURE, METHOD OF MANUFACTURING THE SAME, AND THREE-DIMENSIONAL MEMORY

PRIORITY APPLICATIONS

This application is a U.S. National Stage Filing under 35 U.S.C. § 371 from International Application No. PCT/CN2019/098595, filed on Jul. 31, 2019, and published as WO2021/016922 on Feb. 4, 2021; the benefit of priority of which is hereby claimed herein, and which application and publication are hereby incorporated herein by reference in their entirety.

TECHNICAL FIELD

The present disclosure relates to a field of semiconductor memory and integration technology, and in particular to an L-shaped stepped word line structure, a method of manufacturing the same, and a three-dimensional memory.

BACKGROUND

Three-dimensional NAND memory technology is a key technology currently being developed in China.

Three-dimensional NAND memory is facing a problem of an increasing integration difficulty in the future. A three-dimensional NAND memory with 128-or-more layers faces a word line connection process difficulty. With an increase in the number of layers of the three-dimensional memory, an etching of a word line connection hole requires a higher selection ratio. Otherwise, a probability that the etching of the connection hole breaks through a word line terminal/pad to cause a short circuit between word lines may greatly increase. Furthermore, a difficulty in designing the word line terminal (SS) of the three-dimensional memory is gradually increasing.

SUMMARY

(1) Technical Problem to be Solved

The present disclosure provides an L-shaped stepped word line structure, a method of manufacturing the same, and a three-dimensional memory, so as to at least partially solve the above-mentioned technical problems.

(2) Technical Solution

According to an aspect of the present disclosure, an L-shaped stepped word line structure is provided, including: a plurality of L-shaped word line units, wherein each L-shaped word line unit includes a long side extending in a second direction (y direction) and arranged adjacent to a gate line slit, and a short side extending in a first direction (x direction) and including a word line terminal; wherein the word line terminal is formed in a stepped stacked layer structure including a plurality of stacked layer pairs formed of an insulating material, a region close to the gate line slit in a stacked layer of each stacked layer pair serves as a replacement metal region, the replacement metal region includes a short side region surface metal layer located on a surface of the stacked layer structure and a short side region internal metal layer located in an interior of the stacked layer structure, a length of the short side region surface metal layer in the first direction is greater than a length of the short side region internal metal layer in the first direction, and the word line terminal corresponds to the short side region surface metal layer.

In some embodiments of the present disclosure, a connection hole pad of the word line terminal used to connect a logic control circuit is located in the short side region surface metal layer in a position, where a distance between the connection hole pad and the gate line slit is greater than the length of the short side region internal metal layer.

In some embodiments of the present disclosure, the replacement metal region further includes a long side region surface metal layer located on a surface and a long side region internal metal layer located in an interior, and a length of the long side region surface metal layer in the second direction is equal to a length of the long side region internal metal layer in the second direction.

In some embodiments of the present disclosure, the plurality of L-shaped word line units are sequentially connected in the first direction and distributed in a stepped manner.

In some embodiments of the present disclosure, the plurality of word line units are stacked in a third direction and distributed in a stepped manner in the second direction.

In some embodiments of the present disclosure, the plurality of L-shaped word line units include at least one pair of L-shaped word line units, two paired L-shaped word line units are separated by the gate line slit and distributed in a mirror misalignment by a height of a step, the height of the step is equal to a height of a stacked layer pair, and a direction of the misalignment is a third direction (z direction) perpendicular to the first direction and the second direction.

In some embodiments of the present disclosure, the L-shaped stepped word line structure further includes: a protection layer located between the plurality of L-shaped word line units and above each word line unit, wherein the gate line slit penetrates an upper surface of the protection layer.

In some embodiments of the present disclosure, the long side of the L-shaped word line unit is used for connecting a core region.

According to another aspect of the present disclosure, a method of manufacturing an L-shaped stepped word line structure is provided, including: manufacturing a stepped stacked layer structure including a plurality of stacked layer pairs formed of an insulating material, wherein each stacked layer pair serves as a step; dividing the stacked layer structure into a plurality of regions, wherein the stacked layer structure in each region is used to form an L-shaped word line unit; processing an end of a surface step of the stacked layer structure in each region, so that an etching rate of the end of the surface step in the first direction is greater than an etching rate of a structure below the end of the surface step in the first direction; etching a processed stacked layer structure to form a gate line slit extending in a second direction, wherein a depth direction of the etching is perpendicular to a surface of the stacked layer structure; etching and hollowing a region close to the gate line slit in a stacked layer of each stacked layer pair based on the gate line slit, so that a size of an etched region of the stacked layer in the surface step in the first direction is greater than a size of an etched region of a structure right below the surface step in the first direction; depositing a metal material in a hollowed region to obtain a replacement metal region including a short side region surface metal layer located on a surface of the stacked layer structure and a short side region internal metal layer located in an interior of the stacked layer structure, wherein a length of the short side region surface metal layer in the first direction is greater than a length of the short side region internal metal layer in the first direction, and the word line terminal corresponds to the short side region surface metal layer; and forming a plurality of L-shaped word line units accordingly, wherein each L-shaped word line unit includes a long side extending in the second direction and arranged adjacent to a gate line slit, and a short side extending in the first direction and including the word line terminal.

In some embodiments of the present disclosure, when the stacked layer structure includes a stacked layer pair containing silicon oxide and silicon nitride, the processing an end of a surface step of the stacked layer structure in each region includes: increasing a nitrogen concentration in the silicon nitride at the end of the surface step by ion implantation or selective deposition.

In some embodiments of the present disclosure, the method further includes a step of forming a protection layer before the step of etching the processed stacked layer structure to form the gate line slit.

In some embodiments of the present disclosure, the method further includes a step of forming a connection hole for connecting a logic control circuit after the step of obtaining the replacement metal region, wherein the connection hole penetrates the protection layer to correspond to and connect a connection hole pad of the word line terminal, and the connection hole pad is located in the short side region surface metal layer at a position where a distance between the connection hole pad and the gate line slit is greater than the length of the short side region internal metal layer.

In some embodiments of the present disclosure, the stepped stacked layer structure protrudes outwardly in the first direction and/or the second direction.

In some embodiments of the present disclosure, the replacement metal region further includes a long side region surface metal layer located on a surface of the stacked layer structure and a long side region internal metal layer located in an interior of the stacked layer structure, and a length of the long side region surface metal layer in the second direction is equal to a length of the long side region internal metal layer in the second direction.

According to yet another aspect of the present disclosure, a three-dimensional memory is provided, including any L-shaped stepped word line structure mentioned in the present disclosure.

REFERENCE NUMERALS

1—word line unit;
11—protection layer; 12—stacked layer structure;
121—first stacked layer material; 122—second stacked layer material;
22—replacement metal region;
221—short side region surface metal layer;
222—short side region internal metal layer;
223—long side region surface metal layer;
224—long side region internal metal layer;
3—gate line slit (GLS); 4—connection hole.

DETAILED DESCRIPTION OF EMBODIMENTS

In the related art, a control circuit and a word line (or a gate line) of a three-dimensional memory may be connected to a stepped word line terminal (SS, Stair Step) through a connection hole (SSCT) perpendicular to a plane. With a continuous increase in a height of the three-dimensional memory, a probability that the SSCT breaks through the SS to cause a short circuit of two or more word lines may continuously increase. A three-dimensional memory with 128 layers and a three dimensional memory with 192 layers require an SSCT etching selection ratio of higher than 400 and higher than 600, respectively, and a three-dimensional memory with more than 192 layers requires a higher SSCT etching selection ratio. However, current etching technologies may not meet the requirement of such selection ratio.

The present disclosure provides an L-shaped stepped word line structure, a method of manufacturing the same, and a three-dimensional memory. At an end of an L-shaped short side step, by setting a size of a surface replacement metal region in a first direction (x direction) to be greater than a size of an internal replacement metal region in the first direction based on a gate line slit, then a connection hole (SSCT) perpendicular to a plane may be positioned based on the gate line slit, so that in the first direction, the SSCT is set to be greater than the size of the internal replacement metal region at the end of the L-shaped short side step. In this way, when the SSCT is connected to the surface replacement metal region at the end of the L-shaped short side step, a plurality of stacked layer pairs, for example, a plurality of silicon oxide/silicon nitride stacked layer pairs, in a stacked layer structure may be located below the SSCT, and then an insulating layer being arranged below a metal layer of each contact point is realized, so that it may be ensured that even if the etching is excessive in a case that the etching selection ratio is not high enough, a word line short circuit may not occur.

Figure 1:
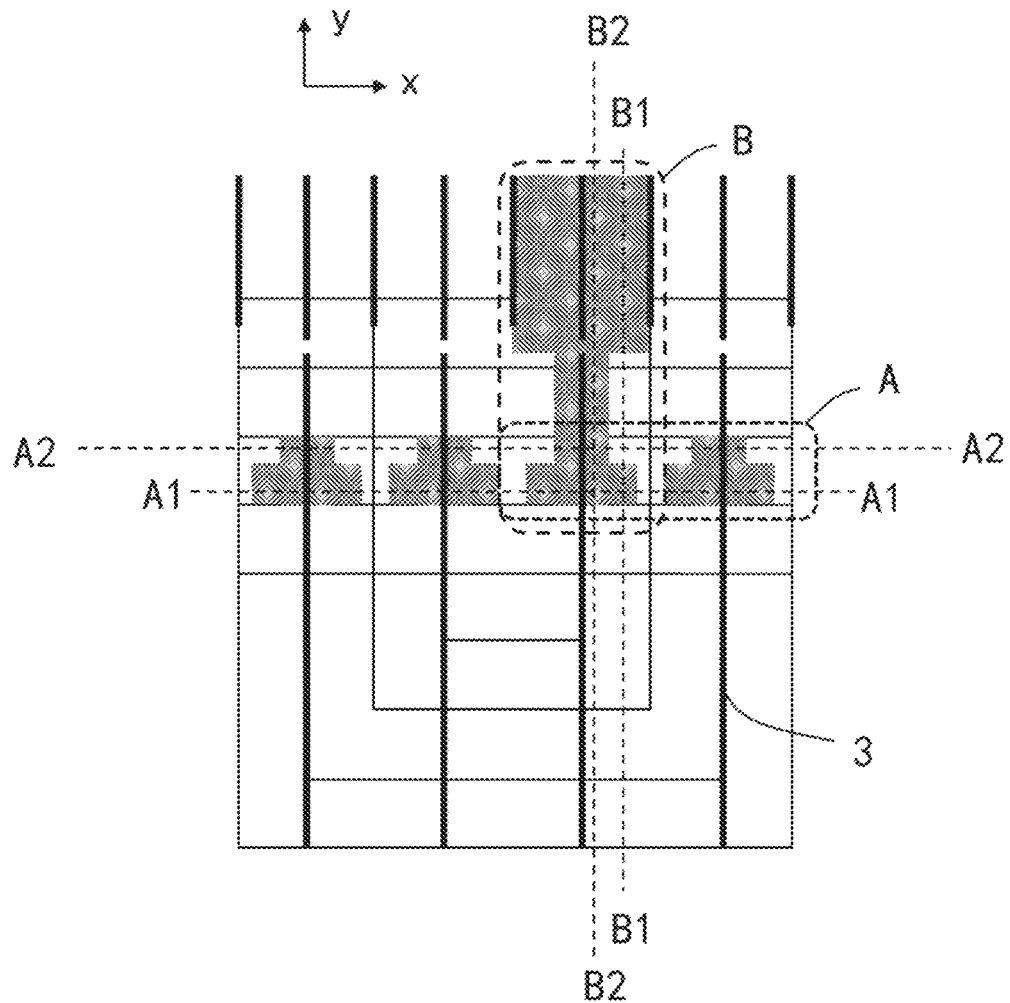
FIG. 1 is a top view of an L-shaped stepped word line structure according to an embodiment of the present disclosure.
Figure 2:
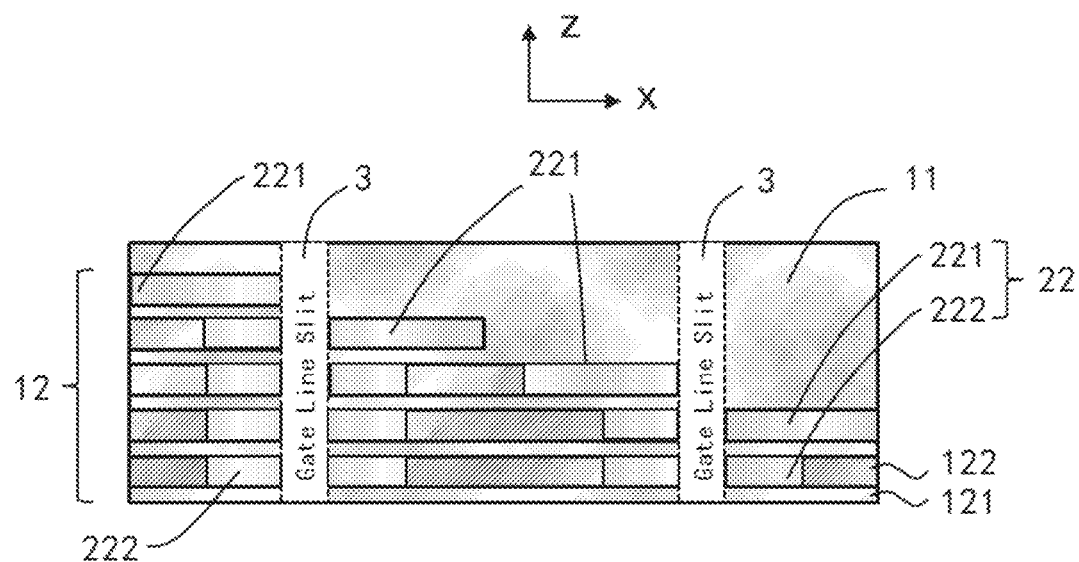
FIG. 2 is a schematic structural diagram of a circled portion A of the L-shaped stepped word line structure shown in FIG. 1 taken along line A1-A1, which corresponds to a cross-sectional view of an L-shape short side in an x direction.
Figure 6:
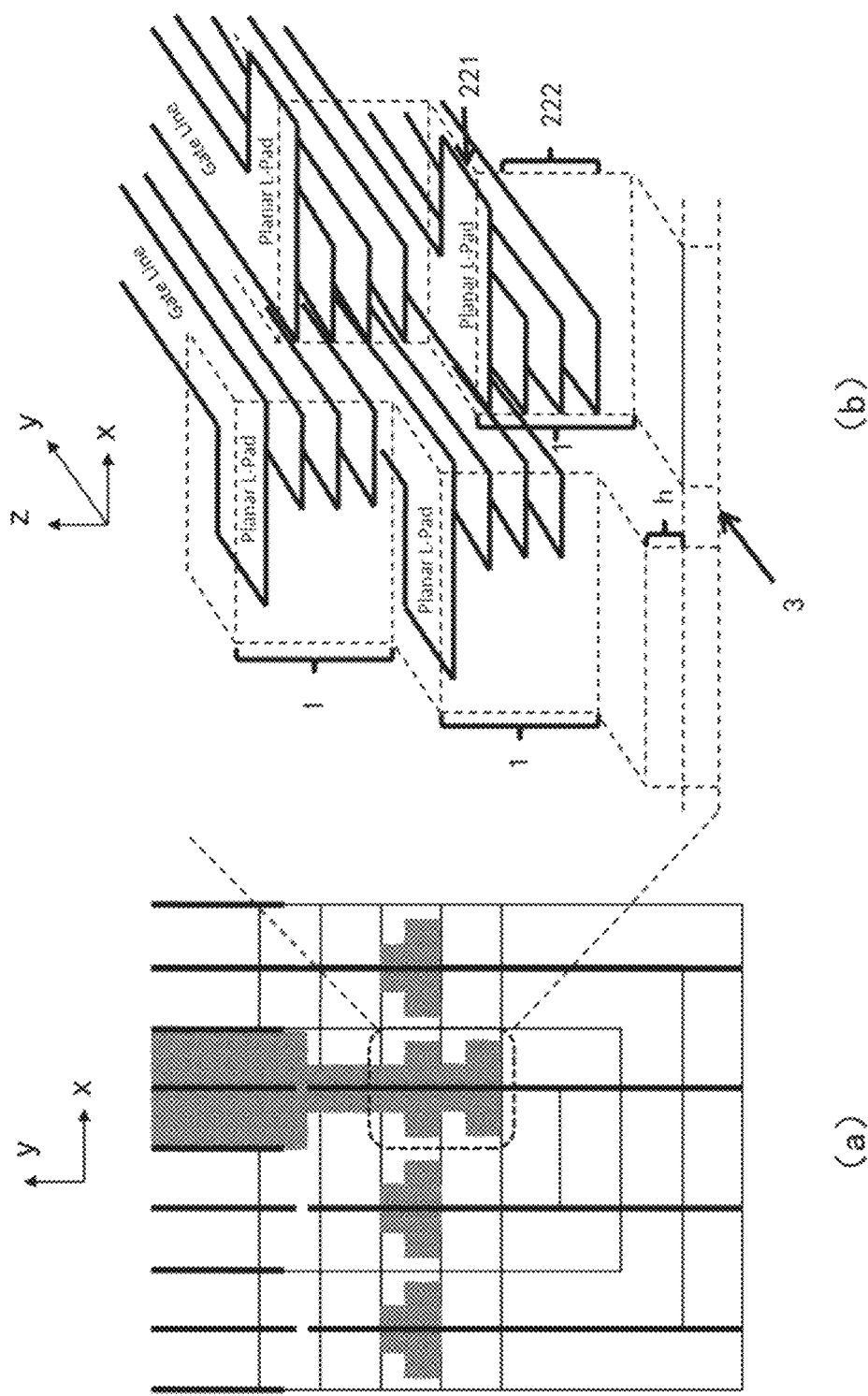
FIG. 6 is a top view (a) of an L-shaped stepped word line structure including a plurality of word line units stacked in a third direction (z direction) and a schematic diagram (b) of a three-dimensional structure of an enlarged detail portion of FIG. 6(*a*).

In the L-shaped stepped word line structure of the present disclosure, an L-shape is presented in a top view, and the L-shaped stepped word line structure includes at least two word line units. In an embodiment, a plurality of (two or more) word line units may be sequentially connected in the first direction (x direction) and distributed in a stepped manner. That is, the L-shaped stepped word line structure includes a plurality of word line units arranged in the first direction (x direction), and a tail end of a word line terminal of a previous word line unit in the plurality of word line units and a head end of a word line terminal of a latter word line unit are distributed in a stepped manner. Four word line units distributed in the x direction are illustrated in FIG. 1, and a connection relationship between two adjacent word line units is illustrated in FIG. 2. In another embodiment, the plurality of word line units may also be stacked in a third direction (z direction) and distributed in a stepped manner. That is, the plurality of stacked word line units may sequentially protrude outwardly in a second direction (y direction, a negative y-axis direction shown in FIG. 6(b)), so as to form a stacked layer of the plurality of word line units distributed in the stepped manner. A height difference h between steps is a height of a stacked layer pair. FIG. 6(a) illustrates two word line units stacked in the z direction, and FIG. 6(b) illustrates a form of the two stacked word line units distributed in the stepped manner.

In the embodiments of the present disclosure, in the L-shaped stepped word line structure, the replacement metal region is manufactured by first etching a second stacked layer material located on two end regions of the gate line slit based on the gate line slit and then filling a metal. Therefore, in an embodiment, the word line units appear in pairs, and L-shaped word line units in pairs are illustrated in the context (two word line units in a "┌┐" shape are illustrated in FIG. 1). As shown in FIG. 1 and FIG. 2, two paired word line units are separated by the gate line slit and distributed in a mirror misalignment (by a height of a step). In other methods, the L-shaped word line unit may be formed only on one side of the gate line slit. Therefore, the number of the word line units may be an odd number or an even number, which is not limited to a paired even number.

In the L-shaped stepped word line structure of the present disclosure, a long side of the L shape is used for connecting a core region, and a short side of the L shape is used as a contact terminal/pad connected to the control circuit. By adjusting (or by using any other adjustment method for achieving an etching rate difference) an ion concentration in a surface region of the end of the short side step of the L shape, an etching rate (of wet etching or other etching methods) in the surface region may be greater than an etching rate in an internal region. Based on the etching rate difference between the surface layer and an internal material, a structure in which the size of the short side region surface metal layer in the first direction (x direction) is greater than that of the short side region internal metal layer (located below the short side region surface metal layer) in the first direction may be obtained. That is, in the first direction, a length of the short side region surface metal layer is greater than a length of the short side region internal metal layer. An inner part below the short side region surface metal layer is the short side region internal metal layer, and an outer part below the short side region surface metal layer includes a plurality of stacked layer pairs (remained without being etched) in the stacked layer structure. In this way, a structure in which a bottom corresponds to an L-shaped surface metal edge position being an insulating layer may be formed, and during an etching and a contact of the connection hole, it may be ensured that even if the etching is excessive in a case that the etching selection ratio is not high enough, a word line short circuit may not occur.

In order to make objectives, technical solutions and advantages of the present disclosure more apparent, the present disclosure will be further described in detail below in connection with specific embodiments and with reference to the drawings.

First Embodiment

In a first exemplary embodiment of the present disclosure, there is provided an L-shaped stepped word line structure.

Figure 3:
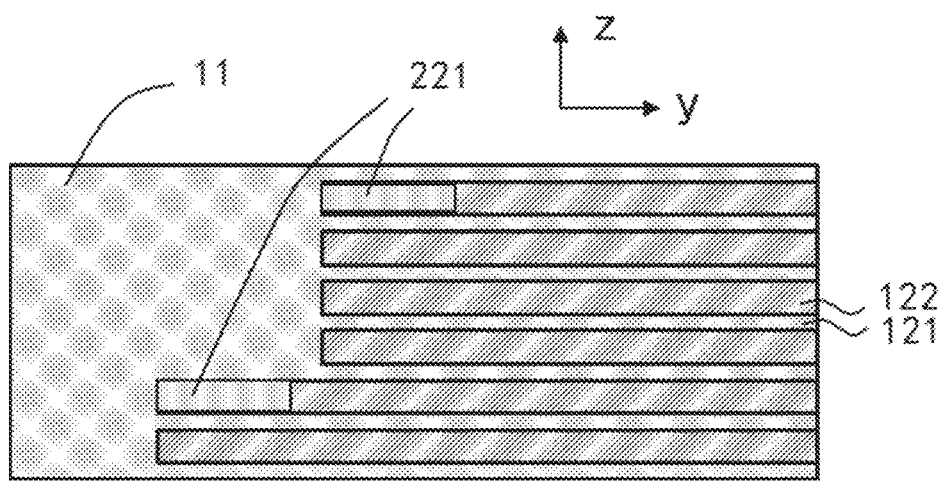
FIG. 3 is a schematic structural diagram of a circled portion B of the L-shaped stepped word line structure shown in FIG. 1 taken along line B1-B1, which corresponds to a cross-sectional view of an L-shape short side in a y direction.
Figure 4:
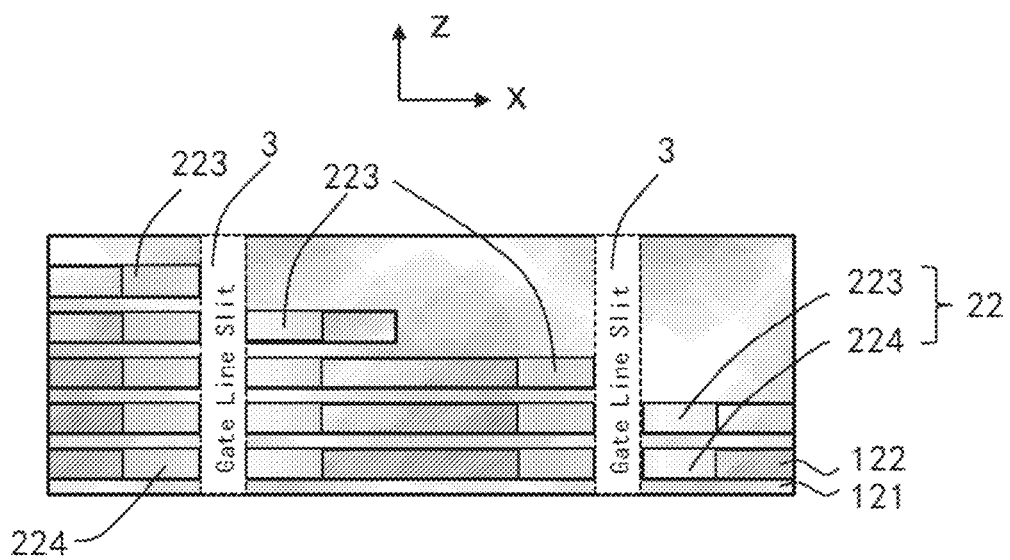
FIG. 4 is a schematic structural diagram of a circled portion A of the L-shaped stepped word line structure shown in FIG. 1 taken along line A2-A2, which corresponds to a cross-sectional view of an L-shape long side in an x direction.
Figure 5:
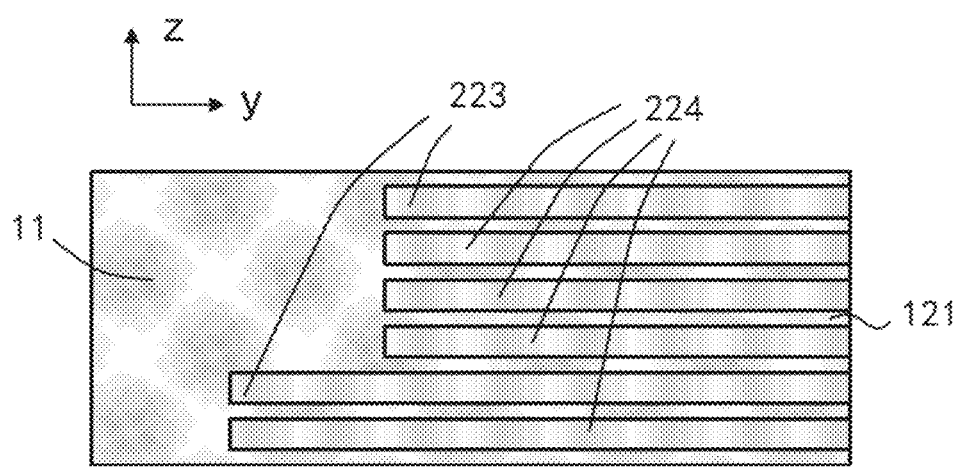
FIG. 5 is a schematic structural diagram of the circled portion B of the L-shaped stepped word line structure shown in FIG. 1 taken along line B2-B2, which corresponds to a cross-sectional view of an L-shape long side in a y direction.

FIG. 1 is a top view of an L-shaped stepped word line structure according to an embodiment of the present disclosure. FIG. 2 is a schematic structural diagram of a circled portion A of the L-shaped stepped word line structure shown in FIG. 1 taken along line A1-A1, which corresponds to a cross-sectional view of an L-shape short side in an x direction. FIG. 3 is a schematic structural diagram of a circled portion B of the L-shaped stepped word line structure shown in FIG. 1 taken along line B1-B1, which corresponds to a cross-sectional view of an L-shape short side in a y direction. FIG. 4 is a schematic structural diagram of a circled portion A of the L-shaped stepped word line structure shown in FIG. 1 taken along line A2-A2, which corresponds to a cross-sectional view of an L-shape long side in an x direction. FIG. 5 is a schematic structural diagram of a circled portion B of the L-shaped stepped word line structure shown in FIG. 1 taken along line B2-B2, which corresponds to a cross-sectional view of an L-shape long side in a y direction.

It should be noted that in this embodiment, a word line unit is illustrated by using a stacked layer structure formed by four stacked layer pairs. With reference to the cross-sectional views of the long side in FIG. 3 and FIG. 5, it is obvious that a short side region surface metal layer 221 of a corresponding word line terminal is located in a top layer in the four stacked layer pairs. In order to illustrate the stacked layer pairs corresponding to the insulating layers below the word line terminals of the two word line units, six stacked layer pairs are illustrated in FIG. 3 and FIG. 5. In FIG. 2 and FIG. 4, two L-shaped word line unit pairs arranged in the first direction (x direction) are illustrated. In two adjacent L-shaped word line unit pairs, a tail end of a word line terminal of a previous word line unit pair and a head end of a word line terminal of a latter word line unit pair are distributed in a stepped manner. Inside each L-shaped word line unit pair, two paired word line units are separated by the gate line slit and distributed in a mirror misalignment by a height of a step. Five stacked layer pairs are illustrated in order to clearly show that in the first direction, a length of the short side region surface metal layer 221 located in the surface layer (top layer) is greater than a length of a short side region internal metal layer 222 located below (inside) the short side region surface metal layer 221. Those skilled in the art may know a cross-sectional structural diagram of short sides and long sides of a plurality of (two or more) L-shaped word line unit pairs according to the above schematic diagrams.

With reference to FIG. 1 to FIG. 5, the L-shaped stepped word line structure of the present disclosure includes at least one pair of L-shaped word line units. Each L-shaped word line unit 1 includes a long side extending in a second direction (y direction) and arranged adjacent to a gate line slit 3, and a short side extending in a first direction (x direction) and including a word line terminal. The word line terminal is formed in a stacked layer structure 12 including a plurality of stacked layer pairs formed of an insulating material. A region close to the gate line slit 3 in a stacked layer (for example, a stacked layer formed of a second stacked layer material 122) of each stacked layer pair serves as a replacement metal region 22, so that the replacement metal region 22 includes a short side region surface metal layer 221 located on a surface and a short side region internal metal layer 222 located in an interior. In the first direction, a length of the short side region surface metal layer 221 is greater than a length of the short side region internal metal layer 222, and the word line terminal corresponds to the short side region surface metal layer 221.

In the embodiment, the L-shape long side is used for connecting a core region, and the L-shape short side is used as a contact terminal/pad connected to a control circuit.

With reference to FIG. 1 to FIG. 3, in the L-shape short side, the replacement metal region 22 includes the short side region surface metal layer 221 located on the surface and the short side region internal metal layer 222 located in the interior, and in the first direction, the length of the short side region surface metal layer 221 is greater than the length of the short side region internal metal layer 222. With reference to FIG. 1, FIG. 4 and FIG. 5, in the L-shape long side, the replacement metal region 22 includes a long side region surface metal layer 223 located on a surface and a long side region internal metal layer 224 located in an interior, and in the second direction (y direction), a length of the long side region surface metal layer 223 is equal to a length of the long side region internal metal layer 224.

It should be noted that as a whole, the long side region surface metal layer 223 and the short side region surface metal layer 221 are portions of a diffusion layer (a surface diffusion layer) diffused in two directions (the first direction and the second direction), which are respectively located on the long side and the short side. For ease of description and distinction of the long side and the short side, different names are used for the two portions, but the two portions are substantially two directions of an L-shaped diffusion layer. Similarly, the long side region internal metal layer 224 and the short side region internal metal layer 222 are also portions of a diffusion layer (an internal diffusion layer) diffused in two directions. Correspondingly, the L-shape long side in the L-shaped stepped structure is used for connecting the core region, and the replacement metal region corresponding to the L-shape long side has a uniform length. The L-shape short side is used as the contact terminal/pad connected to the control circuit, and a surface size of the replacement metal region corresponding to the L-shape short side is greater than an internal size thereof. Comparing the whole surface replacement metal region with the whole internal replacement metal region, the surface replacement metal region may appear as an "L" shape with a longer short side, the internal replacement metal region may appear as an "I" shape, and the lengths of the long sides of the "L" shape and the "I" shape (in the y direction) are the same. Alternatively, in other embodiments, the surface replacement metal region may appear as an "L" shape with a longer short side, the internal replacement metal region may appear as an "L" shape with a shorter short side, and the lengths of the long sides of the two "L" shapes are the same.

In the embodiment, as shown in FIG. 1 and FIG. 2, two paired word line units 1 are separated by the gate line slit 3 and distributed in a mirror misalignment by a height of a step, the height of the step is equal to a height of a stacked layer pair, and a direction of the misalignment is a third direction (z direction) perpendicular to the first direction and the second direction.

In this embodiment, the stacked layer pair 12 includes a plurality of stacked layer pairs formed of an insulating material, and each stacked layer pair includes a first stacked layer material 121 and the second stacked layer material 122. For example, the first stacked layer material 121 may be silicon oxide, and the second stacked layer material 122 may be silicon nitride.

Figure 7:
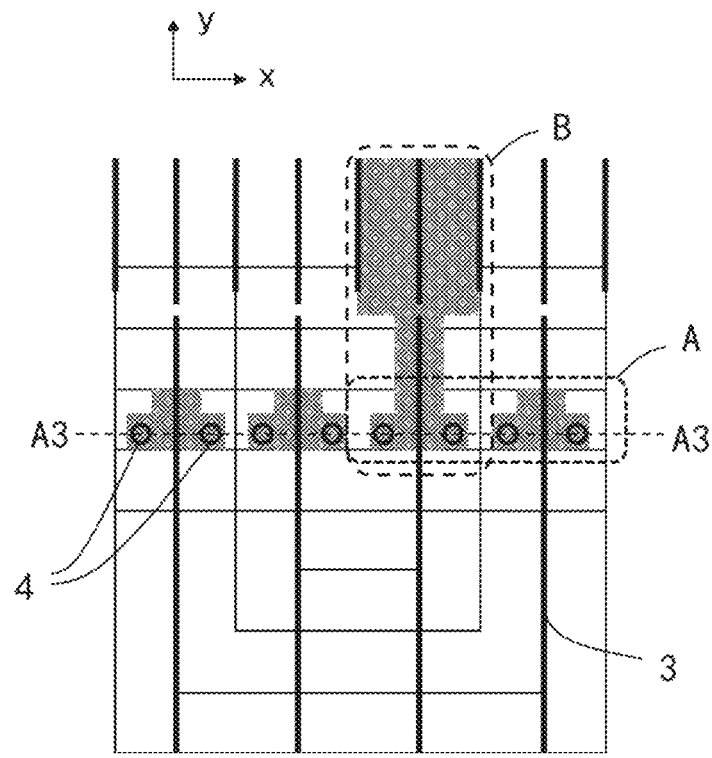
FIG. 7 is a schematic structural diagram in which a connection hole contacts a short side region surface metal layer in a three-dimensional memory including the L-shaped stepped word line structure shown in FIG. 1 so as to realize a connection of a logic control circuit and a word line.
Figure 8:
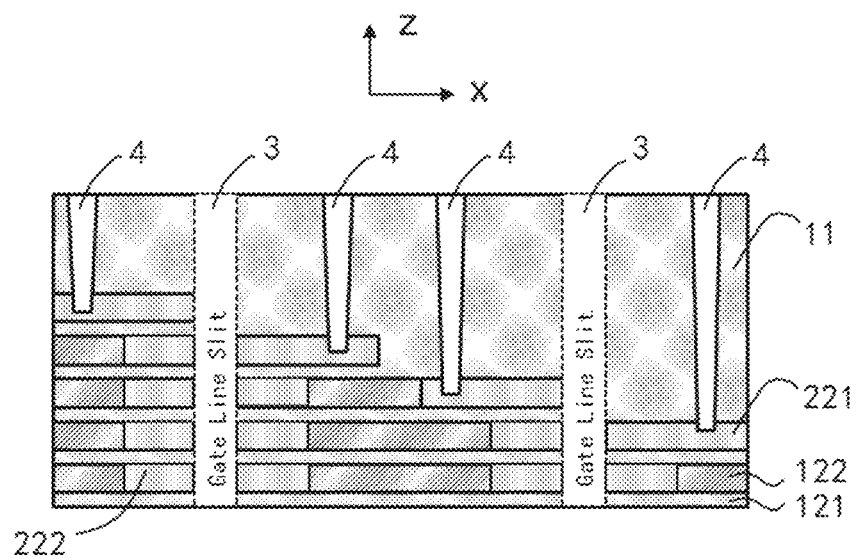
FIG. 8 is a schematic structural diagram of a circled portion A of the structure shown in FIG. 7 taken along line A3-A3, which corresponds to a cross-sectional view of an L-shape short side in an x direction.

A distribution of a plurality of word line units or a plurality of word line unit pairs will be described below with reference to the drawings. FIG. 6(a) is a top view of an L-shaped stepped word line structure including a plurality of word line units stacked in a third direction (z direction), and FIG. 6(b) is a schematic diagram of a three-dimensional structure of an enlarged detail portion of FIG. 6(a). FIG. 7 is a schematic structural diagram in which a connection hole contacts a short side region surface metal layer in a three-dimensional memory including the L-shaped stepped word line structure shown in FIG. 1 so as to realize a connection of a logic control circuit and a word line. FIG. 8 is a schematic structural diagram of a circled portion A of the structure shown in FIG. 7 taken along line A3-A3, which corresponds to a cross-sectional view of an L-shape short side in the x direction.

In an embodiment, a plurality of (two or more) word line units may be sequentially connected in the first direction (x direction) and distributed in a stepped manner. That is, a plurality of word line units are arranged in the first direction (x direction), and a tail end of a word line terminal of a previous word line unit in the plurality of word line units and a head end of a word line terminal of a latter word line unit are distributed in a stepped manner. Four word line units distributed in the x direction are illustrated in FIG. 1, and a connection relationship between two adjacent word line units is illustrated in FIG. 2.

In the embodiment, the word line unit pair is illustrated by way of example. As shown in FIG. 1 to FIG. 3, at least two pairs of word line units are arranged in the first direction. As shown by a circled region A in FIG. 1, in two adjacent L-shaped word line unit pairs, a tail end of a word line terminal of a previous word line unit pair and a head end of a word line terminal of a latter word line unit pair are distributed in a stepped manner. Inside each L-shaped word line unit pair, two paired word line units are separated by the gate line slit and distributed in a mirror misalignment by a height of a step.

In another embodiment, a plurality of word line units may be stacked in the third direction (z direction) and distributed in a stepped manner in the second direction (y direction). FIG. 6(a) illustrates two word line units stacked in the z direction, and FIG. 6(b) illustrates the form distributed in the stepped manner. That is, the plurality of word line units stacked in the third direction may sequentially protrude outwardly in the second direction (y direction) to form a stacked layer of the plurality of word line units distributed in the stepped manner. A direction of the outward protrusion may refer to a negative y-axis direction shown in FIG. 6(b). The height difference h between steps is a height of a stacked layer pair. In this embodiment, the height of the stacked layer pair is a height of the silicon oxide/silicon nitride stacked layer pair. Certainly, a manner in which a plurality of word line unit pairs are stacked in the z-axis is similar to a manner in which two word line units are stacked up and down, which will not be repeated here. The word line unit pair differs in that inside each word line unit, a layout in which two paired word line units are separated by the gate line slit and distributed in a mirror misalignment by a height of a step is required.

Certainly, in other embodiments, the two layouts described above may be combined. That is, the plurality of word line units may be stacked in the third direction, the plurality of word line units stacked in the third direction may sequentially protrude outwardly in the second direction (y direction), and the plurality of word line units are sequentially connected in the first direction and distributed in a stepped manner.

Referring to FIG. 7 and FIG. 8, in the embodiment, a connection hole (4) pad of the word line terminal used to connect the logic control circuit is located in the short side region surface metal layer 221 at a position where a distance from the connection hole pad to the gate line slit 3 is greater than the length of the short side region internal metal layer 222.

In the embodiment, referring to FIG. 2 to FIG. 5, the L-shaped stepped word line structure may further include a protection layer located between the plurality of L-shaped word line units 1 and above each word line unit 1, and the gate line slit 3 penetrates an upper surface of the protection layer 11.

In summary, in the embodiment, at the L-shape short side step end, by setting the size of the surface replacement metal region in the first direction (x direction) to be greater than the size of the internal replacement metal region in the first direction based on the gate line slit, then a connection hole (SSCT) perpendicular to a plane may be positioned based on the gate line slit, the SSCT may be set to be located in a position where the size of the SSCT in the first direction is greater than the size of the internal replacement metal region at the end of the L-shape short side step in the first direction. In this way, when the SSCT is connected to the surface replacement metal region at the end of the L-shape short side step, a plurality of stacked layer pairs, for example, a plurality of silicon oxide/silicon nitride stacked layer pairs, in the stacked layer structure may be located below the SSCT, and an insulating layer being arranged below a metal layer of each contact point is realized, so that even if the etching is excessive in a case that an etching selection ratio is not high enough, a word line short circuit may not occur.

Second Embodiment

In a second exemplary embodiment of the present disclosure, there is provided a method of manufacturing an L-shaped stepped word line structure. A method of manufacturing the L-shaped stepped word line structure in the first embodiment is illustrated by way of example in this embodiment.

Figure 9:
FIG. 9 is a flowchart of a method of manufacturing an L-shaped stepped word line structure according to an embodiment of the present disclosure.

FIG. 9 is a flowchart of a method of manufacturing an L-shaped stepped word line structure according to an embodiment of the present disclosure.

Referring to FIG. 9, the method of manufacturing the L-shaped stepped word line structure in the embodiment includes following steps.

In step S201, a stepped stacked layer structure including a plurality of stacked layer pairs formed of an insulating material is manufactured, and each stacked layer pair serves as a step.

In an embodiment of the present disclosure, the stepped stacked layer structure 12 may protrude outwardly in the first direction and/or the second direction.

"A and/or B" means A alone or B alone or both A and B.

In this embodiment, the stacked layer pair 12 may include a plurality of stacked layer pairs formed of an insulating material, and each stacked layer pair includes the first stacked layer material 121 and the second stacked layer material 122. For example, the first stacked layer material 121 may be silicon oxide, and the second stacked layer material 122 may be silicon nitride.

In step S202, the stacked layer structure is divided into a plurality of region, and the stacked layer structure in each region is used to form an L-shaped word line unit.

In the embodiment, the L-shape long side is used for connecting a core region, and the L-shape short side is used as the contact terminal/pad connected to the control circuit. Circuits of the core region and the SS terminal (stepped word line terminal, corresponding to the short side) needs to be divided into regions (blocks) through a selection of a top select gate.

In step S203, an end of a surface step of the stacked layer structure in each region is processed, so that in the first direction, an etching rate of the end of the surface step is greater than an etching rate of a structure below the end of the surface step.

In some embodiments of the present disclosure, when the stacked layer structure includes a stacked layer pair containing silicon oxide and silicon nitride, processing the end of the surface step of the stacked layer structure in each region may include: increasing a nitrogen concentration in the silicon nitride at the end of the surface step by ion implantation or selective deposition.

Certainly, an etching rate difference may be realized by various methods. In this embodiment, wet etching is used in cooperation with the method of changing the ion concentration. In other embodiments, other adjustment methods may be used, and any method capable of realizing the etching rate difference falls within the protection scope of the present disclosure.

In step S204, the processed stacked layer structure is etched to form a gate line slit, the gate line slit extends in the second direction, and a depth direction of the etching is perpendicular to a surface of the stacked layer structure.

The gate line slit 3 may be formed between adjacent regions or on a middle line of a region so as to form a word line unit pair, and two paired word line units 1 are separated by the gate line slit 3 and distributed in a mirror misalignment. As shown in FIG. 1 and FIG. 2, one side of the gate line slit (e.g., a left side in FIG. 2) is tangent to the surface step of a stacked layer structure, and penetrates other steps of the stacked layer structure below the surface step.

In step S205, a region close to the gate line slit in a stacked layer of each stacked layer pair is etched and hollowed based on the gate line slit.

In the first direction, since the end of the surface step is processed, and the etching rate of the end of the surface step is greater than the etching rate of the structure located below the end of the surface step. Then, after a stacked layer (for example, the stacked layer containing the second stacked layer material 122) in each stacked layer pair is etched and hollowed based on the gate line slit 3, a size of an etched region of the stacked layer in the surface step is greater than a size of an etched region in a structure right below the surface step, which corresponds to an L-shape short side formed subsequently.

In the second direction, a size of an etched region of the stacked layer in the surface step is equal to a size of an etched region in a structure right below the surface step, which corresponds to an L-shape long side formed subsequently.

In step S206, a metal material is deposited in the hollowed region, so as to obtain a replacement metal region, and the word line terminal corresponds to the short side region surface metal layer; accordingly, a plurality of L-shaped word line units are formed, and a long side of each L-shaped word line unit extends in the second direction and arranged adjacent to the gate line slit, and a short side of each L-shaped word line unit extends in the first direction and including the word line terminal.

In the embodiment, as shown in FIG. 2 and FIG. 3, the replacement metal region 11 includes the short side region surface metal layer 221 located on the surface and the short side region internal metal layer 222 located in the interior. In the first direction, the length of the short side region surface metal layer 221 is greater than the length of the short side region internal metal layer 222, and the word line terminal corresponds to the short side region surface metal layer 221.

As shown in FIG. 4 and FIG. 5, the replacement metal region 11 further include the long side region surface metal layer 223 located on the surface and the long side region internal metal layer 224 located in the interior. In the second direction, the length of the long side region surface metal layer 223 is equal to the length of the long side region internal metal layer 224.

In some embodiments of the present disclosure, before the step S204 of etching the processed stacked layer structure to form the gate line slit, the method may further include a step of forming a protection layer. In this embodiment, after the step S203 is performed to process the end of the surface step of the stacked layer structure in each region, in order to form a mask or to protect the surface in the process of etching the stacked layer structure to form the gate line slit in the subsequent step S204, the protection layer 11 may be formed firstly, and then the gate line slit 3 may be formed in the stacked layer structure 12 based on a dry etching process or a wet etching process.

In some embodiments of the present disclosure, after the step S206 of obtaining the replacement metal region, the method may further include a step of forming a connection hole 4 for connecting the logic control circuit. As shown in FIG. 7 and FIG. 8, the connection hole 4 penetrates the protection layer to correspond to and connect a connection hole pad of the word line terminal, and the connection hole pad is located in the short side region surface metal layer at a position where a distance between the connection hole pad and the gate line slit is greater than the length of the short side region internal metal layer.

The method of manufacturing in this embodiment may further include other common steps, or an sequence of performing the method may be changed. Certainly, the method of manufacturing the L-shaped stepped word line structure of the present disclosure is not limited to that shown in this embodiment, and any process capable of forming various composition parts of the L-shaped stepped word line structure and a corresponding positional relationship in the present disclosure falls within the protection scope of the present disclosure.

Third Embodiment

In a third exemplary embodiment of the present disclosure, there is provided a three-dimensional memory including any one of the L-shaped stepped word line structures mentioned in the present disclosure.

In the embodiment, the three-dimensional memory includes an L-shaped stepped word line structure and a logic control circuit. The logic control circuit may correspond to and be connected to a connection hole pad on a word line terminal in each word line unit 1 in the L-shaped stepped word line structure through a connection hole 4. The connection hole pad is located in the short side region surface metal layer at a position where a distance between the connection hole pad and the gate line slit is greater than the length of a short side region internal metal layer. Since an insulating layer is arranged below the connection hole pad, therefore, during an etching and a contact of the connection hole, even if the etching is excessive in a case that an etching selection ratio is not high enough, a word line short circuit may not occur.

In summary, the present disclosure provides an L-shaped stepped word line structure, a method of manufacturing the same, and a three-dimensional memory. At the end of L-shape short side step, the size of the surface replacement metal region in the first direction (x direction) is set to be greater than that of the internal replacement metal region in the first direction based on the gate line slit, then the connection hole (SSCT) perpendicular to the plane may be positioned based on the gate line slit, so that in the first direction, the distance between the SSCT and the gate line slit is greater than the size of the internal replacement metal region at the end of the L-shape short side step. In this way, when the SSCT is connected to the surface replacement metal region at the end of the L-shape short side step, a plurality of stacked layer pairs, for example, a plurality of silicon oxide/silicon nitride stacked layer pairs, in the stacked layer structure may be located below the SSCT, and an insulating layer being arranged below a metal layer of each contact point is realized, so that even if the etching is excessive in a case that an etching selection ratio is not high enough, a word line short circuit may not occur.

It should be noted that throughout the drawings, the same elements are indicated by the same or similar reference numerals. Conventional structures or configurations may be omitted to avoid confusing the understanding of the present disclosure. It should be noted that the shapes and dimensions of components in the drawings do not necessarily reflect actual sizes and/or ratios, but merely illustrate the content of the embodiments of the present disclosure.

The ordinal numbers such as "first," "second," "third," etc., used in the description and claims only intend to modify corresponding elements, which does not mean any ordinal numbers of the elements, or any order of an element and another element, or any order in the method of manufacturing. The ordinal numbers are used only to clearly distinguish an element having a name from another element having the same name.

Furthermore, the word "including" or "comprising" does not exclude the presence of elements or steps not listed in the claims. The word "a" or "an" preceding an element does not exclude the presence of a plurality of the elements.

Unless there are technical obstacles or contradictions, various features in the above-described embodiments of the present disclosure may be freely combined to form additional embodiments, and these additional embodiments all fall within the protection scope of the present disclosure.

The above-described specific embodiments have described in detail the objectives, technical solutions and advantages of the present disclosure. It should be noted that the above are only specific embodiments of the present disclosure, and are not intended to limit the present disclosure. Any modifications, equivalent substitutions, improvements, and the like made within the spirit and scope of the present disclosure shall be included in the protection scope of the present disclosure.

What is claimed is:

1. An L-shaped stepped word line structure, comprising:
a plurality of L-shaped word line units, wherein each L-shaped word line unit comprises a long side extending in a second direction and arranged adjacent to a gate line slit, and a short side extending in a first direction and comprising a word line terminal;
wherein the word line terminal is formed in a stepped stacked layer structure comprising a plurality of stacked layer pairs formed of an insulating material, a region close to the gate line slit in a stacked layer of each stacked layer pair serves as a replacement metal region, the replacement metal region comprises a short side region surface metal layer located on a surface of the stepped stacked layer structure and a short side region internal metal layer located in an interior of the stepped stacked layer structure, a length of the short side region surface metal layer in the first direction is greater than a length of the short side region internal metal layer in the first direction, and the word line terminal corresponds to the short side region surface metal layer.

2. The L-shaped stepped word line structure according to claim 1, wherein a connection hole pad of the word line terminal used to connect a logic control circuit is located in the short side region surface metal layer in a position, where a distance between the connection hole pad and the gate line slit is greater than the length of the short side region internal metal layer.

3. The L-shaped stepped word line structure according to claim 1, wherein the replacement metal region further comprises a long side region surface metal layer located on a surface and a long side region internal metal layer located in an interior, and a length of the long side region surface metal layer is, in the second direction, equal to a length of the long side region internal metal layer in the second direction.

4. The L-shaped stepped word line structure according to claim 1, wherein the plurality of L-shaped word line units are sequentially connected in the first direction and distributed in a stepped manner.

5. The L-shaped stepped word line structure according to claim 1, wherein the plurality of word line units are stacked in a third direction and distributed in a stepped manner in the second direction.

6. The L-shaped stepped word line structure according to claim 1, wherein the plurality of L-shaped word line units comprise at least one pair of L-shaped word line units, two paired L-shaped word line units are separated by the gate line slit and distributed in a mirror misalignment by a height of a step, the height of the step is equal to a height of a stacked layer pair, and a direction of the mirror misalignment is a third direction perpendicular to the first direction and the second direction.

7. The L-shaped stepped word line structure according to claim 1, further comprising:
a protection layer located between the plurality of L-shaped word line units and above each word line unit, wherein the gate line slit penetrates an upper surface of the protection layer.

8. The L-shaped stepped word line structure according to claim 1, wherein the long side of the L-shaped word line unit is used for connecting a core region.

9. A method of manufacturing the L-shaped stepped word line structure according to claim 1, comprising:
manufacturing a stepped stacked layer structure comprising a plurality of stacked layer pairs formed of an insulating material, wherein each stacked layer pair serves as a step;
dividing the stepped stacked layer structure into a plurality of regions, wherein the stepped stacked layer structure in each region is used to form an L-shaped word line unit;
processing an end of a surface step of the stepped stacked layer structure in each region, so that an etching rate of the end of the surface step in the first direction is greater than an etching rate of a structure below the end of the surface step in the first direction;
etching a processed stepped stacked layer structure to form a gate line slit extending in a second direction, wherein a depth direction of the etching is perpendicular to a surface of the stepped stacked layer structure;
etching and hollowing a region close to the gate line slit in a stacked layer of each stacked layer pair based on the gate line slit, so that a size of an etched region of the stacked layer in the surface step in the first direction is greater than a size of an etched region of a structure right below the surface step in the first direction;
depositing a metal material in a hollowed region to obtain a replacement metal region comprising a short side region surface metal layer located on a surface of the stepped stacked layer structure and a short side region internal metal layer located in an interior of the stepped stacked layer structure, wherein a length of the short side region surface metal layer in the first direction is greater than a length of the short side region internal metal layer in the first direction, and the word line terminal corresponds to the short side region surface metal layer; and
forming a plurality of L-shaped word line units accordingly, wherein each L-shaped word line unit comprises a long side extending in the second direction and arranged adjacent to a gate line slit, and a short side extending in the first direction and comprising the word line terminal.

10. The method according to claim 9, wherein when the stepped stacked layer structure comprises a stacked layer pair containing silicon oxide and silicon nitride, the processing an end of a surface step of the stepped stacked layer structure in each region comprises: increasing a nitrogen concentration in the silicon nitride at the end of the surface step by ion implantation or selective deposition.

11. The method according to claim 9, further comprising a step of forming a protection layer before the step of etching the processed stepped stacked layer structure to form the gate line slit.

12. The method according to claim 11, further comprising a step of forming a connection hole for connecting a logic control circuit after obtaining the replacement metal region, wherein the connection hole penetrates the protection layer to correspond to and connect a connection hole pad of the word line terminal, and the connection hole pad is located in the short side region surface metal layer at a position where a distance between the connection hole pad and the gate line slit is greater than the length of the short side region internal metal layer.

13. The method according to claim 9, wherein the stepped stacked layer structure protrudes outwardly in the first direction and/or the second direction.

14. The method according to claim 9, wherein the replacement metal region further comprises a long side region surface metal layer located on a surface of the stepped stacked layer structure and a long side region internal metal layer located in an interior of the stepped stacked layer structure, and a length of the long side region surface metal layer in the second direction is equal to a length of the long side region internal metal layer in the second direction.

15. A three-dimensional memory, comprising the L-shaped stepped word line structure according to claim 1.

* * * * *